US012619170B2

(12) United States Patent (10) Patent No.: US 12,619,170 B2
Cunbul et al. (45) Date of Patent: May 5, 2026

(54) PROJECTION UNIT FOR A LEVEL SENSOR, METHOD OF MONITORING HEIGHT OF A SUBSTRATE, AND LITHOGRAPHIC SYSTEM COMPRISING THE PROJECTION UNIT

(71) Applicant: ASML NETHERLANDS B.V., Veldhoven (NL)

(72) Inventors: Ahmet Burak Cunbul, Eindhoven (NL); Ferry Zijp, Nuenen (NL); Teunis Willem Tukker, Eindhoven (NL); Peter Fernand William Jozef Dendas, Koersel (BE); Abraham Franciscus Hubertus Van Gessel, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 100 days.

(21) Appl. No.: 18/717,286

(22) PCT Filed: Dec. 5, 2022

(86) PCT No.: PCT/EP2022/084431
§ 371 (c)(1),
(2) Date: Jun. 6, 2024

(87) PCT Pub. No.: WO2023/117393
PCT Pub. Date: Jun. 29, 2023

(65) Prior Publication Data
US 2025/0044715 A1 Feb. 6, 2025

(30) Foreign Application Priority Data
Dec. 23, 2021 (EP) ..................................... 21217562

(51) Int. Cl.
*G03F 9/00* (2006.01)

(52) U.S. Cl.
CPC .......... *G03F 9/7065* (2013.01); *G03F 9/7034* (2013.01)

(58) Field of Classification Search
CPC ............................. G03F 9/7065; G03F 9/7034
See application file for complete search history.

(56) References Cited

U.S. PATENT DOCUMENTS

| 7,265,364 B2 | 9/2007 | Teunissen et al. |
| 7,646,471 B2 | 1/2010 | Teunissen et al. |
| (Continued) | | |

FOREIGN PATENT DOCUMENTS

| TW | 202111319 | 3/2021 |
| WO | 2016/102127 | 6/2016 |
| WO | 2020/057924 | 3/2020 |

OTHER PUBLICATIONS

International Search Report and Written Opinion issued in corresponding PCT Patent Application No. PCT/EP2022/084431, dated Mar. 13, 2023.

(Continued)

*Primary Examiner* — Hung V Nguyen
(74) *Attorney, Agent, or Firm* — Pillsbury Winthrop Shaw Pittman, LLP

(57) ABSTRACT

A projection unit for a level sensor, the projection unit including: a first light pipe having a first inlet configured to receive radiation from a source and a first outlet; and a second light pipe having a second inlet configured to receive the radiation from the first light pipe and a second outlet. The unit may include a lens device configured to receive radiation from the second outlet and to output radiation having a predetermined distribution of intensity and irradiance.

20 Claims, 8 Drawing Sheets

(56)  References Cited

U.S. PATENT DOCUMENTS

| | | | |
|---|---|---|---|
| 8,488,107 B2* | 7/2013 | Den Boef | B82Y 10/00 |
| | | | 355/72 |
| 9,488,465 B2* | 11/2016 | Khuat Duy | G01B 11/0608 |
| 10,241,425 B2* | 3/2019 | Reijnders | G03F 9/7046 |
| 10,747,128 B2* | 8/2020 | Lee | G03F 7/7055 |
| 11,467,505 B2* | 10/2022 | Butler | G03F 9/7096 |
| 12,204,229 B2* | 1/2025 | Bauerschmidt | G03F 9/7026 |
| 2004/0018158 A1 | 1/2004 | Rosen | |
| 2005/0046807 A1 | 3/2005 | Hanano | |
| 2006/0062013 A1 | 3/2006 | Imade | |
| 2007/0052953 A1 | 3/2007 | Hill | |
| 2007/0159700 A1 | 7/2007 | Danner et al. | |
| 2010/0233600 A1 | 9/2010 | Den Boef et al. | |
| 2014/0152991 A1 | 6/2014 | Heo et al. | |
| 2017/0219934 A1 | 8/2017 | Markle et al. | |

OTHER PUBLICATIONS

G. Avila et al., "High efficiency inexpensive 2-slices image slicers," Proc. of SPIE, vol. 8446 (2012).

* cited by examiner

PROJECTION UNIT FOR A LEVEL SENSOR, METHOD OF MONITORING HEIGHT OF A SUBSTRATE, AND LITHOGRAPHIC SYSTEM COMPRISING THE PROJECTION UNIT

CROSS-REFERENCE TO RELATED APPLICATION

The application is the U.S. national phase entry of PCT Patent Application No. PCT/EP2022/084431 which was filed on Dec. 5, 2022, which claims priority of European Patent Application No. 21217562.4 which was filed on Dec. 23, 2021 and which is incorporated herein in its entirety by reference.

FIELD

The present invention relates to a projection unit, a method of monitoring height, and a lithographic system comprising the projection unit. The projection unit may be used in a level sensor or applied to another kind of metrology assembly. The level sensor may be suitable for measuring a height of, for instance, a surface of a wafer, a substrate or a reticle in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features that are patterned on the substrate. Typical wavelengths currently in use are 365 nm (i-line), 248 nm (KrF), 193 nm (ArF) and 13.5 nm (EUV). A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

At such short wavelengths, precise positioning of the patterning device and/or substrate within the lithographic apparatus is essential.

US20070159700 discloses an apparatus for inspecting a specular surface, comprising: a light source; a collector optics for collecting the light from the light source; a homogenizing optics for transmitting the light from the collector optics having a first micro-lens array downstream of the collector optics; a second micro-lens array downstream of the first micro-lens array; a Fourier optics for transmitting the light from the homogenizing optics onto the specular surface. The apparatus includes a light source 10 formed by the output surface of a fiberoptic bundle. Other point-like light sources are also conceivable. The light is generated by a flash lamp with a reflector and coupled into the fiber-optic bundle.

US20070052953 discloses an illumination system that can be used with a coherent light source. The system includes a diffuser that is illuminated by a coherent laser beam. In one such illumination system, the surface of the diffuser is imaged onto the entrance of a homogenizing rod. The Fourier transform plane of the diffuser surface is imaged into the system pupil, and the exit of the homogenizing rod is imaged into the system field. In such a system, the scatter distribution from the diffuser determines the light distribution in the system pupil. Speckle modulation in the image is minimized by rotating the diffuser during the integration time of the imaging sensor. The one or more second optical elements may also include one or more optical elements that are configured to collect light exiting the homogenizer.

US20170219934 discloses compact apparatuses for projecting an image onto a substrate are provided. In one embodiment, an image projection apparatus includes a light pipe coupled to a first mounting plate, and a frustrated prism assembly, one or more digital micro-mirror devices, one or more beamsplitters, and one or more projection optics, which are coupled to a second mounting plate. The first and second mounting plates are coplanar, such that the image projection apparatus is compact and may be aligned in a system having a plurality of image projection apparatuses.

US20140152991 discloses a level sensor of an exposure apparatus including a light source that generates light that is illuminated onto a top surface of a wafer, a projection part provided in a path of incident light propagating from the light source to the wafer and having a single first slit, a detection part provided in a path of light reflected from the wafer and having a single second slit, and a detector that detects the reflected light that is incident on the second slit of the detection part.

Although the systems and sensors disclosed in the documents referenced above generally work well, there is always a drive to improve, to simplify, increase efficiency, to reduce capital expenditure or operating costs. For instance, current projection units typically have relatively low optical transmission efficiency, many parts and high associated cost.

It is an object of at least one embodiment of at least one aspect of the present invention to obviate or at least mitigate at least one of the above identified shortcomings of the prior art.

SUMMARY

The present disclosure provides a projection unit for a level sensor, comprising:
- a first light pipe having a first inlet configured to receive radiation from a source and a first outlet; and
- a second light pipe having a second inlet configured to receive the radiation from the first light pipe and a second outlet.

In an embodiment, the projection unit comprises: a lens device configured to receive radiation from the second outlet and to output radiation having a predetermined distribution of intensity and irradiance.

In an embodiment, the lens device has a focal point on one side located at the second outlet In an embodiment, the first light pipe has tapering walls, wherein a width and height of the first inlet exceeds a width and height of the first outlet.

In an embodiment, the first light pipe is symmetrical along its longitudinal axis.

In an embodiment, the second light pipe has tapering walls, wherein a width and height of the second outlet exceeds a width and height of the second inlet.

In an embodiment, the second light pipe is asymmetrical along its longitudinal axis.

In an embodiment, the second inlet has a ratio of width with respect to height in the range of 1:1.5 to 1:14; and/or the second outlet has a ratio of width with respect to height in the range of 1:1.

In an embodiment, the projection unit comprises a grating arranged on an opposite side of the lens system to be illuminated by the radiation exiting the lens device, the grating comprising an array of grating units, each grating unit being provided with a number of slits having a predetermined size to filter the radiation.

In an embodiment, the grating units is rectangular, and the slits are arranged obliquely with respect to sides of the respective grating unit.

In an embodiment, the projection unit comprises an image multiplier device arranged to receive radiation exiting the projection grating, the radiation exiting the projection grating having an aspect ratio, and the image multiplier device being adapted to increase said ratio.

In an embodiment, the radiation exiting the projection grating having an aspect ratio of width to height of at least 1:1.5, and the image multiplier device being adapted to increase said ratio to at least 1:2.

In an embodiment, the projection unit comprises: a light module comprising a light source to produce the radiation; and a light guide configured to receive the radiation from the light module and transfer the radiation to the first light pipe.

In an embodiment, the light guide is a single multimode fiber.

According to another aspect, the present disclosure provides a lithographic system comprising a level sensor for measuring height of a substrate, the level sensor comprising a projection unit as described above.

According to yet another aspect, the disclosure provides a metrology assembly comprising a projection unit as described above.

According to another aspect, the present disclosure provides a method of monitoring height of a substrate using a level sensor having a projection unit, the method comprising the steps of: directing radiation to a first light pipe; and using a second light pipe to receive radiation exiting the first light pipe.

In an embodiment, the method comprises the step of using a lens system to receive radiation exiting the second light pipe, the lens system being configured to output radiation having a predetermined distribution of intensity and irradiance.

BRIEF DESCRIPTION OF THE DRAWINGS

Embodiments of the invention will now be described, by way of example only, with reference to the accompanying schematic drawings, in which.

DETAILED DESCRIPTION

Figure 1:
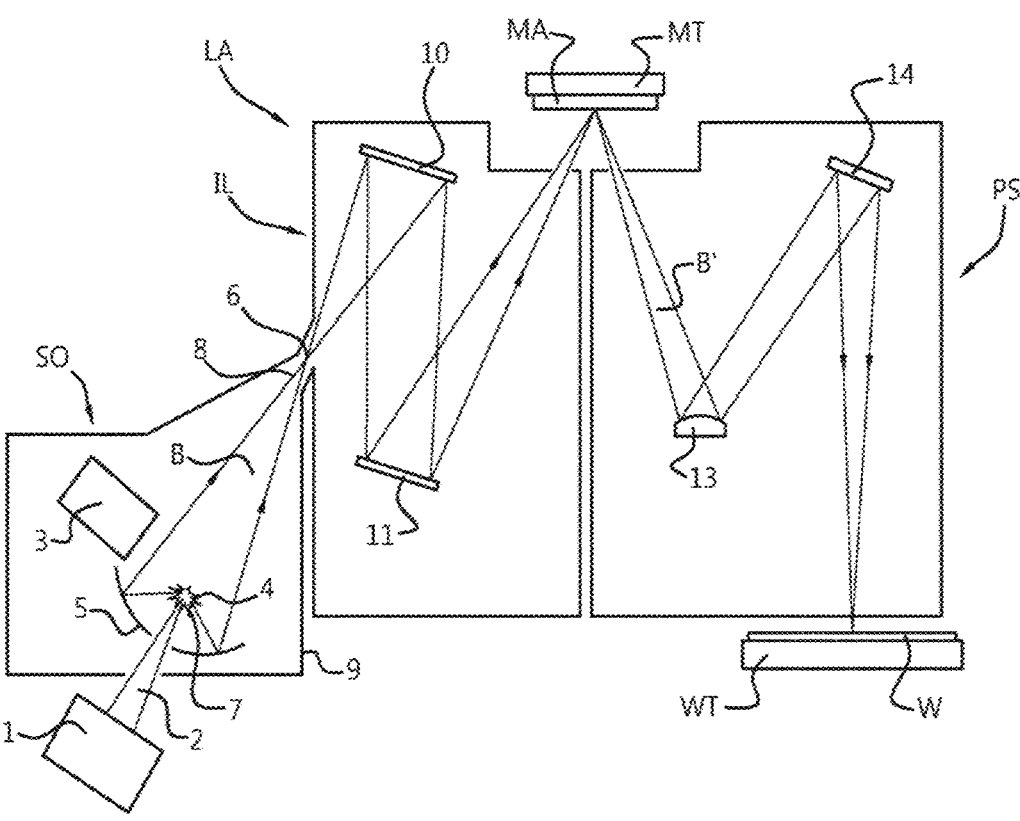
FIG. 1 depicts an example of a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Although hereinbelow, a level sensor LS has generally been described with reference to a wafer W in a lithographic apparatus LA of FIG. 1, please note that the level sensor LS may be equally suitable for measuring the height of a surface of any substrate in any lithographic apparatus, including but not limited to lithographic apparatuses based on EUV, DUV (deep ultra-violet), or UV (ultra-violet) radiation.

Figure 2A:
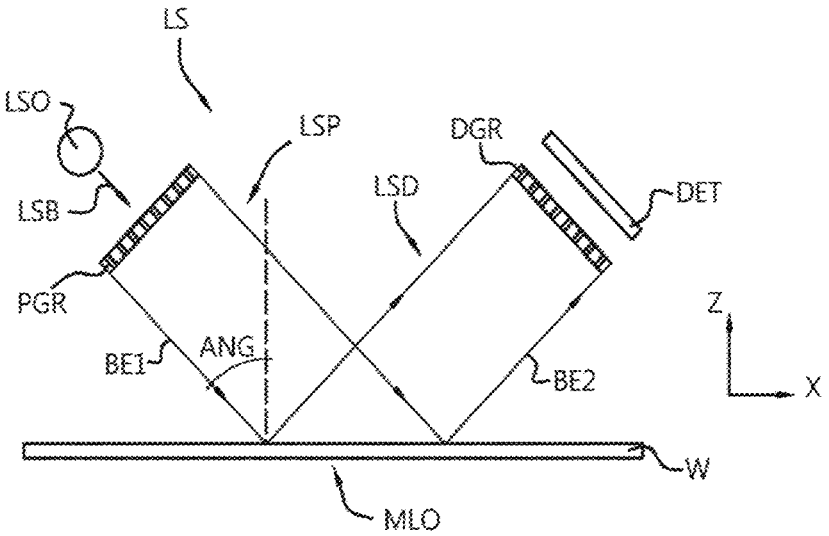
FIG. 2A schematically depicts an exemplary level sensor suitable for the lithographic apparatus of FIG. 1.

FIG. 2A shows a generic example of a level sensor LS for measuring a height of the wafer W. A topography measurement system, level sensor or height sensor, which may be integrated in the lithographic apparatus LA, is typically arranged to measure a topography of a top surface of a substrate (such as the wafer W). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

An example of a level or height sensor LS is schematically shown in FIG. 2A, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR may comprise a periodic grating comprising a periodic structure. Radiation passing the PGR results in a beam of radiation BE1 having a periodically varying intensity. See FIG. 2A. During use, the beam of radiation BE1, having the periodically varying intensity, is directed towards a measurement location MLO, for instance on the substrate W, at an angle of incidence ANG with respect to an axis (Z-axis in FIG. 2A) perpendicular to the incident substrate surface. The angle ANG is between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

Figure 2B:
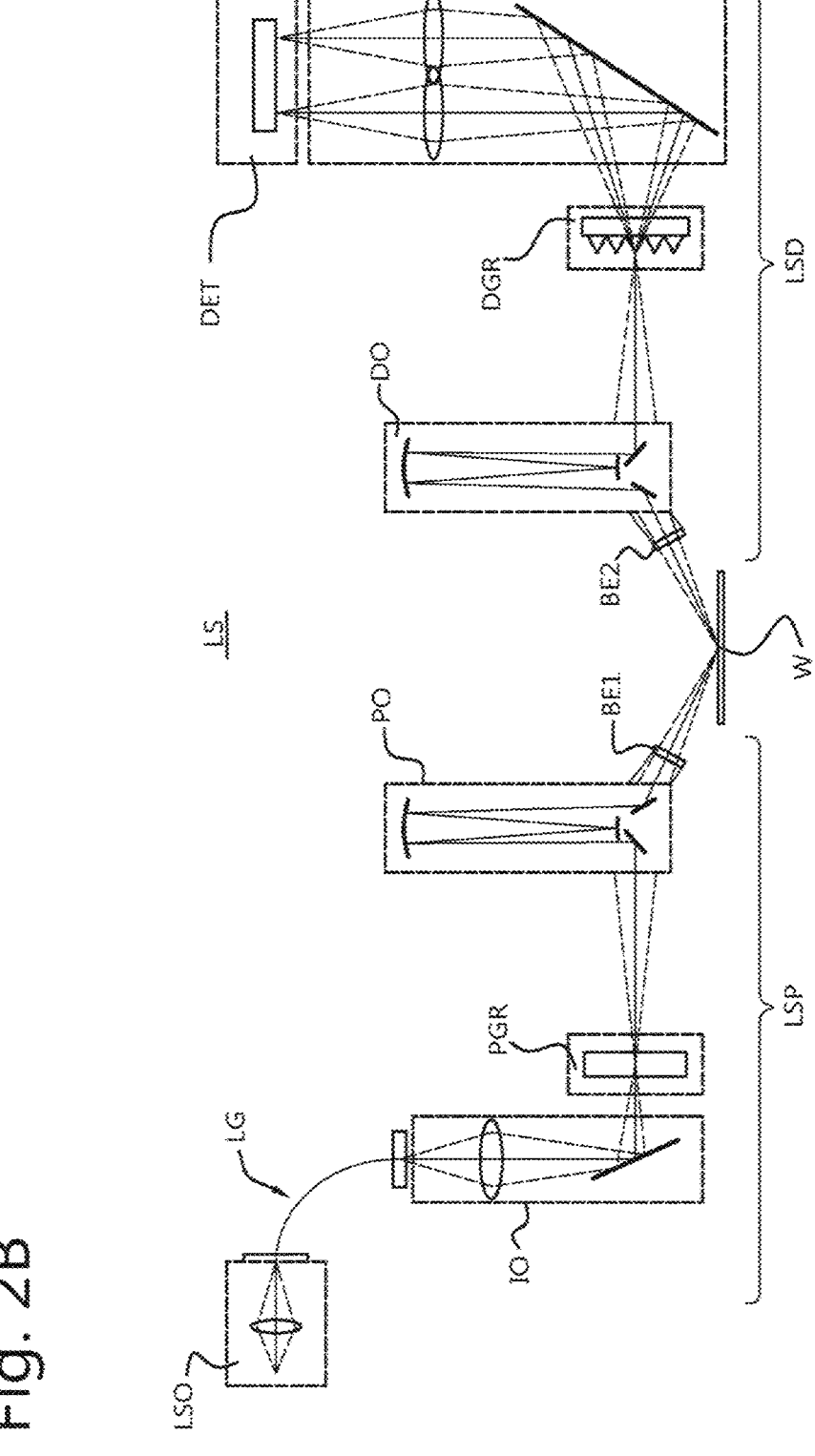
FIG. 2B depicts a schematic overview of an exemplary level sensor.

Referring to FIG. 2B, still at a generic level, the level sensor LS may comprise a light guide LG to guide the radiation exiting the light source LSO to illumination optics IO. The illumination optics may change the shape and structure of the radiation, including irradiance distribution and intensity distribution. The radiation is forward to the projection grating PGR. The projection unit LSP and/or the detection unit LSD may include further optical elements, such as lenses and/or mirrors, along the path of the patterned beam of radiation between the projection grating PGR and the detection grating DGR. As generically shown in FIG. 2B, the projection side of the level sensor LS may comprise projection optics PO. The detection side of the level sensor LS may comprise detection optics DO. The projection optics and/or detection optics guide and direct the light, thus allowing the projector LSP and detector LSD to be arranged at a location of choice. Said location may be relatively remote from the substrate W to minimize interference between the level sensor LS and any elements, either internal or external, of or related to the projection system LS.

In an embodiment of the level sensor, the detection grating DGR may be omitted, and the detector DET may be placed at the position where the detection grating DGR is located. Such a configuration provides a more direct detection of the image of radiation exiting the projection grating PGR and reflected on the surface of the substrate.

In order to cover the surface of the substrate W effectively, the level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Referring to FIGS. 3 and 4A to 4C, an embodiment of the projector LSP comprises a first light pipe 50 having a first inlet 52 configured to receive the radiation from the light guide LG and a first outlet 54 for outputting radiation. The projector comprises a second light pipe 56 having a second inlet 58. The second inlet is configured to receive the radiation from the first light pipe 50. The second light pipe comprises a second outlet 60 for outputting radiation.

The projection unit LSP may comprise a light module LSO comprising a light source to produce the radiation. A light guide LG may be provided to receive the radiation from the light module and transfer the radiation to the first light pipe 50. In a practical embodiment, the light guide LG may be a single multimode fiber. The single fiber may have a substantially round cross-section. The single fiber may alternatively have a cross-section of the form of substantially any other appropriate shape such as e.g. a square, a semi-circle, a rectangle, etc. For additional detail, reference is made to FIGS. 8A to 8C and the related description below.

The projection unit LSP may comprise a lens or lens device 70. The lens device may be configured to receive radiation output from the second outlet 60 and to output radiation having a predetermined distribution of intensity and irradiance.

In an embodiment, the lens device 70 has a first focal point on a first side of the lens device, the first focal point being located substantially at the second outlet 60. At the second outlet herein may refer to the first focal point being substantially located in the plane of the second outlet 60 of the second light pipe. The lens 70 herein may be referred to as a Fourier lens.

In an embodiment, the projector LSP may comprise an image multiplier device 72. The image multiplier 72 may be arranged to receive radiation exiting the projection grating 70. The radiation exiting the projection grating 70 may have a certain aspect ratio, meaning a ratio between width and height of the beam of radiation. The image multiplier device may be adapted to increase said ratio.

Figure 3:
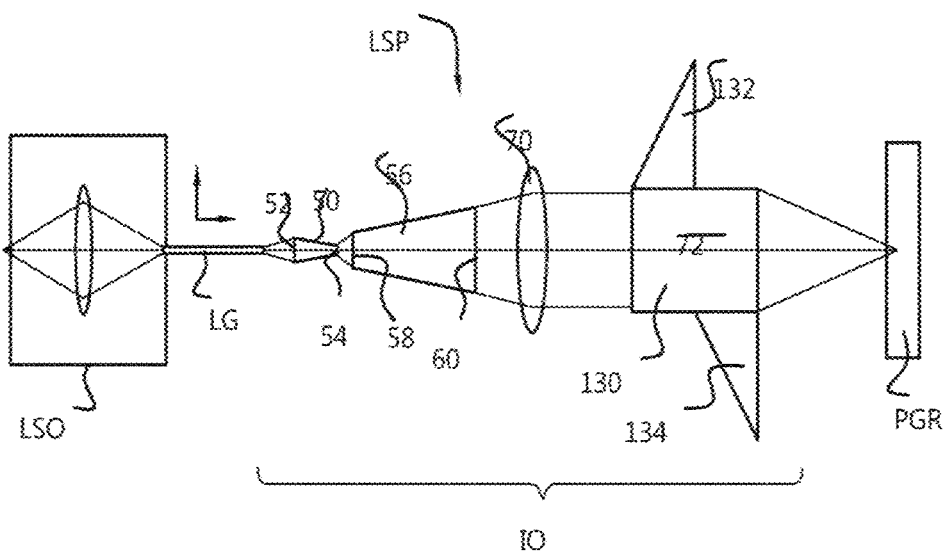
FIG. 3 depicts a schematic overview of an embodiment of a projection unit according to the disclosure, suitable for the level sensor of FIG. 2.
Figures 4A, 4B, 4C:
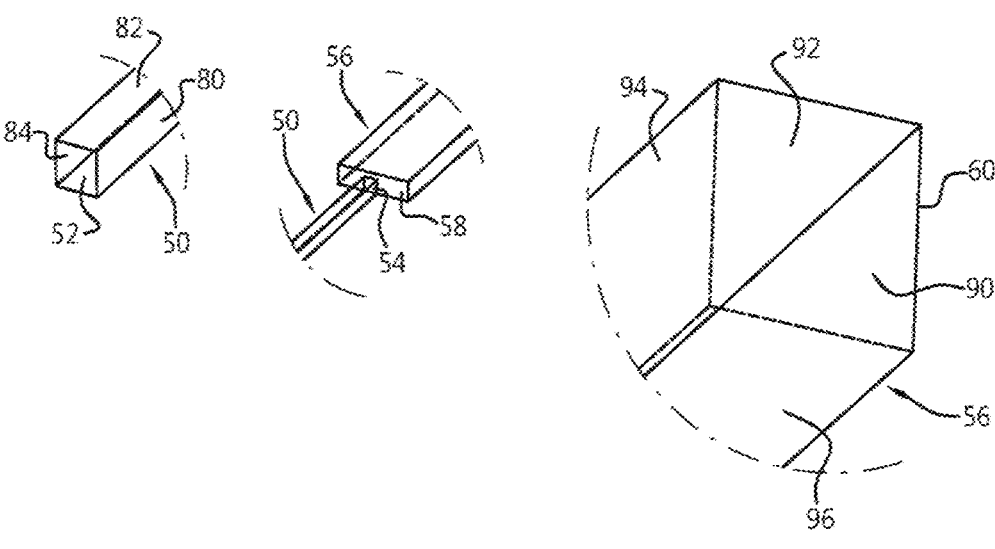
FIG. 4 depicts a perspective view of an embodiment of a part of a projection unit according to the disclosure.

Referring to FIGS. 3 and 4A, the first light pipe 50 may have tapering walls. Herein, a width and height of the first inlet 52 exceeds a width and height of the first outlet 54. The first inlet 52 and/or the first outlet 54 may be substantially rectangular. In a practical embodiment, the first inlet and/or the first outlet are substantially square.

A light pipe is a rod that collects, guides and redistributes light with high efficiency from the source to the target. The redistributed light has uniform irradiance. Light pipes are used in many optical systems such as backlight units of liquid crystal displays, lighting or automotive dashboards. Light pipes can be metallic and hollow making use of the reflectivity of metals to reflect light making the beam travel inside the pipe. They can also be made of a dielectric and use total internal reflection (TIR) to reflect light on the walls of the pipe. The behavior of the light pipe is the same whether the pipe is hollow or glass-filled. A difference is light loss, as in light pipes made of a dielectric, total internal reflection is lossless. Meanwhile, a metallic light pipe suffers from light loss at each reflection and if R is the reflection coefficient of the metal then the transmitted flux F is:

$$\Phi_{transmitted} = \Phi_{incident} \times R^{\,number\;of\;reflections}$$

As the number of reflections is lower in a dielectric light pipe, the transmitted flux is higher for a dielectric light pipe than for a metallic light pipe. Furthermore, mirrors need glue or expensive packaging solutions in order to withstand UV, which is not needed for light pipes made of a single piece of glass.

As the incoming beam is delivered through the fiber LG, the incident light on the first pipe has a uniform intensity. The light pipes will subsequently homogenize the irradiance distribution. The radiation exiting the first and/or second light pipe will have a substantially uniform irradiance distribution.

FIG. 4B shows a detail of the optics IO, showing an example of the connection between the first light pipe 50 and the second light pipe 56. A distance between the first and second light pipe, i.e. between the first outlet and the second inlet, may vary, for instance, in the range of 0 to 50 cm. The second light pipe may have tapering walls. Herein, a width and height of the second outlet exceeds a width and height of the second inlet. In other words, the second light pipe tapers from a smaller cross section at the second inlet to a wider cross section at the second outlet.

In an embodiment, the second light pipe 56 may be asymmetrical along its longitudinal axis. See FIG. 4B. For instance, the second inlet 58 may be longitudinal. The second light pipe may be positioned such that the second inlet 58 is upright (with the longer side directed upward) or flat (as shown in FIG. 4B, with the longer side positioned horizontally).

In a practical embodiment, sides of the second inlet 58 may have a ratio in the range of 1:1.5 to 1:14, for instance about 1:3 to 1:6. Said ratio may relate to width with respect to height, or height with respect to width. In a practical embodiment, the second inlet is positioned with its longer side substantially vertical. The second outlet may have a ratio of width with respect to height in the range of 1:0.8 to 1:1.2. In a preferred embodiment the second outlet is square and width to height thereof is 1:1. The taper of the second light pipe may be determined by a ratio of inlet height to outlet height (i.e. height of the second inlet to height of the second outlet), which may be in the range of about 1:2 to 1:7. See FIG. 4C in this respect.

Figure 8A:
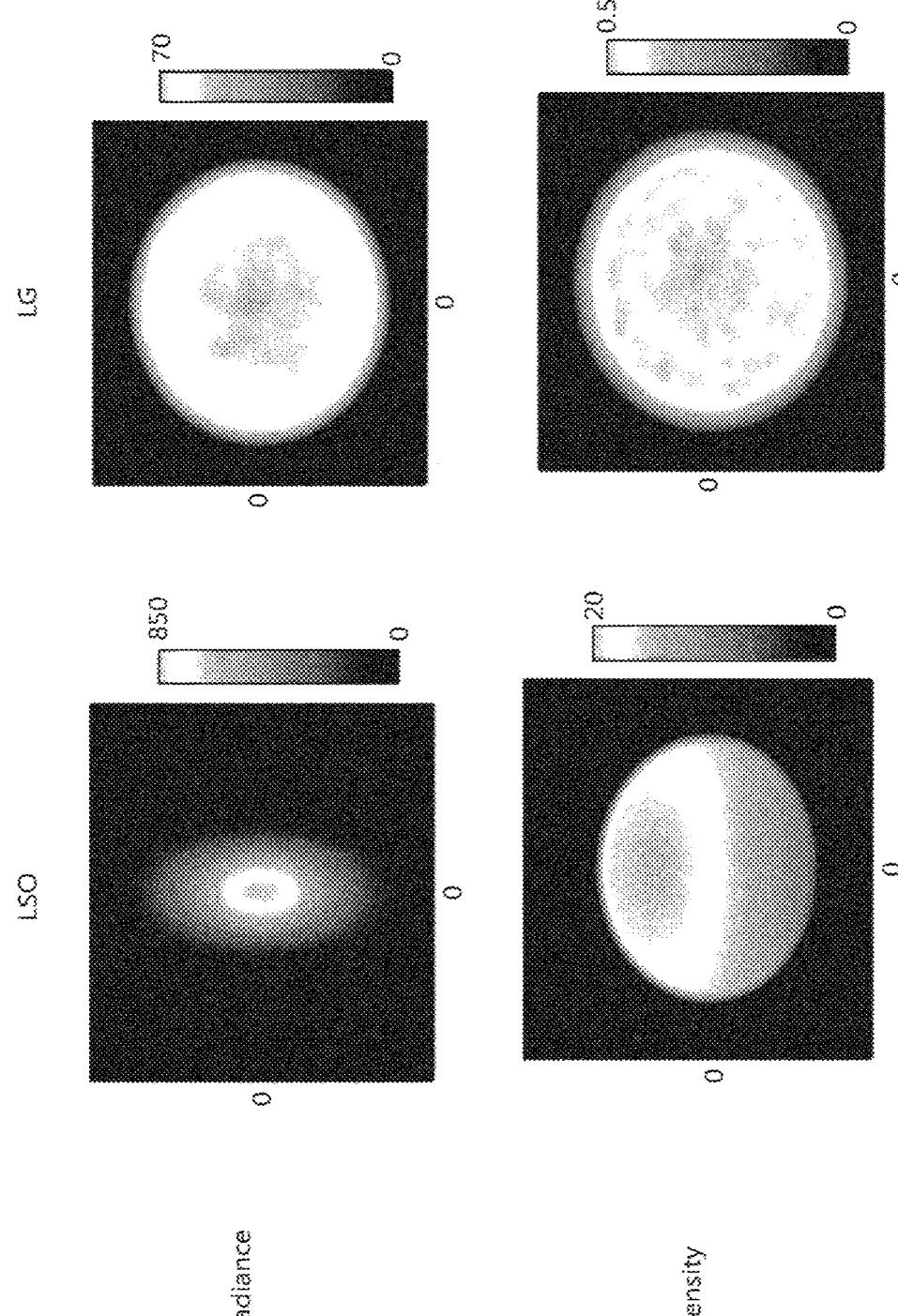
FIGS. 8A to 8C depict exemplary diagrams of irradiance distribution (top row) and intensity distribution (bottom row) of radiation exiting respective elements of the projection unit of the present disclosure.

The first light pipe 50 may have four side walls 80, 82, 84 (FIG. 8A). The first light pipe 50 may be symmetrical along its longitudinal axis. The second light pipe 56 may have four side walls 90, 92, 94, 96 (FIG. 8C). The second light pipe 56 may be symmetrical or asymmetrical along its longitudinal axis.

In a practical embodiment, the first light pipe and/or the second light pipe may be made of a transparent material, such as glass. Alternatively, the first light pipe and/or the second light pipe may comprise reflective side walls. Herein, the inlet and outlet of the respective light pipe and the internal volume between the walls is substantially open.

For tapering light pipes, or in other words light pipes with non-parallel side walls, $$\theta_{out} = \frac{\theta_{in}}{\tau}.$$

Herein, $\theta_{out}$ is an angle of incident radiation (radiation entering the inlet of a respective light pipe), $\theta_{in}$ is an angle of radiation exiting a respective light pipe, and $$\tau = \frac{D}{d},$$

which is the ratio between the outlet surface area D and an inlet surface area d of the respective light pipe. As a result, the change in area from inlet to exit of the respective light pipe results in a change in numerical aperture NA. The change in NA is proportional to the change in surface area. Thus, the first light pipe decreases the NA, while the second light pipe increases the NA.

Adding the taper allows to use a higher input NA and therefore provide a better uniformization of the irradiance while the output NA is sufficiently low to limit strain on the lens to meet requirements at the target.

In principle, a single light pipe may be sufficient to achieve the same result. However, the combination of the first light pipe (decreasing the NA) and the second light pipe (increasing the NA) allows to limit the overall length of the light pipe assembly. With a single light pipe, in practice the light pipe would be relatively long, for instance having a length exceeding several meters. The assembly of the first light pipe 50 and the second light pipe 56 may, in practice, have a combined length not exceeding 1 meter.

The size of the illumination spot on the target y' is predetermined. The outcoming NA ($NA_{out}$) from the second light pipe fixes the object field for the Fourier lens 70. In a practical embodiment, the object field angle of the Fourier lens 70 is limited to less than 10°. Thus the lens remains in the paraxial regime where it is easier to design the lens and wherein the error due to the paraxial approximation is less than 0.5%. This means that $NA_{out}$ is fixed. With these two parameters fixed, the focal length of the lens 70 is:

$$f = \frac{y'}{\sin\theta}$$

As the exit surface of the second light pipe is the position of the pupil of the lens 70, and knowing the NA on the target (on the grating PGR), which is given ($NA_{target}$ is in the order of 0.03), and the focal length calculated above, the front side width of the second light pipe w is as follows:

$$w = 2fNA_{target}$$

As the irradiance distribution of the light pipe will be converted into the intensity distribution on the target by the Fourier lens 70, and the system for a symmetrical intensity distribution, this implies that the irradiance distribution at the output of the second light pipe is symmetrical. Therefore, the output side of the pipe is, in a practical embodiment, square as it is the one to dictate the irradiance shape at the exit of the pipe. Thus, $w_x = w_y$.

We derive the incident NA ($NA_{in}$) on the first and second light pipe:

$$NA_{in} = \tau * NA_{out}$$

where $\tau$ is the taper of the respective light pipe.

For the first light pipe, as $NA_{in}$ exceeds the source NA, in an embodiment a coupling optic is added between the fiber LG and the first light pipe. Then, it is an option to derive the input side width of the first light pipe as $d_x = D/\tau$.

The height of the input side of the first light pipe may shape the intensity distribution exiting the light pipe and therefore shape the irradiance distribution at the target. Since the target, i.e. the grating PGR, may be asymmetrical, the input side of at least the second light pipe may be asymmetrical as well if the source distribution is symmetrical, with the same height to width ratio as that of the illumination spot size. If so:

$$d_y = \frac{y'}{x'}d_x$$

where x' and y' respectively are the width and the height of the target size (the grating PGR).

The length of the light pipe is selected such that it provides the best homogenization of the irradiance distribution at the output of the light pipe given the other geometrical parameters.

Figures 5, 6:
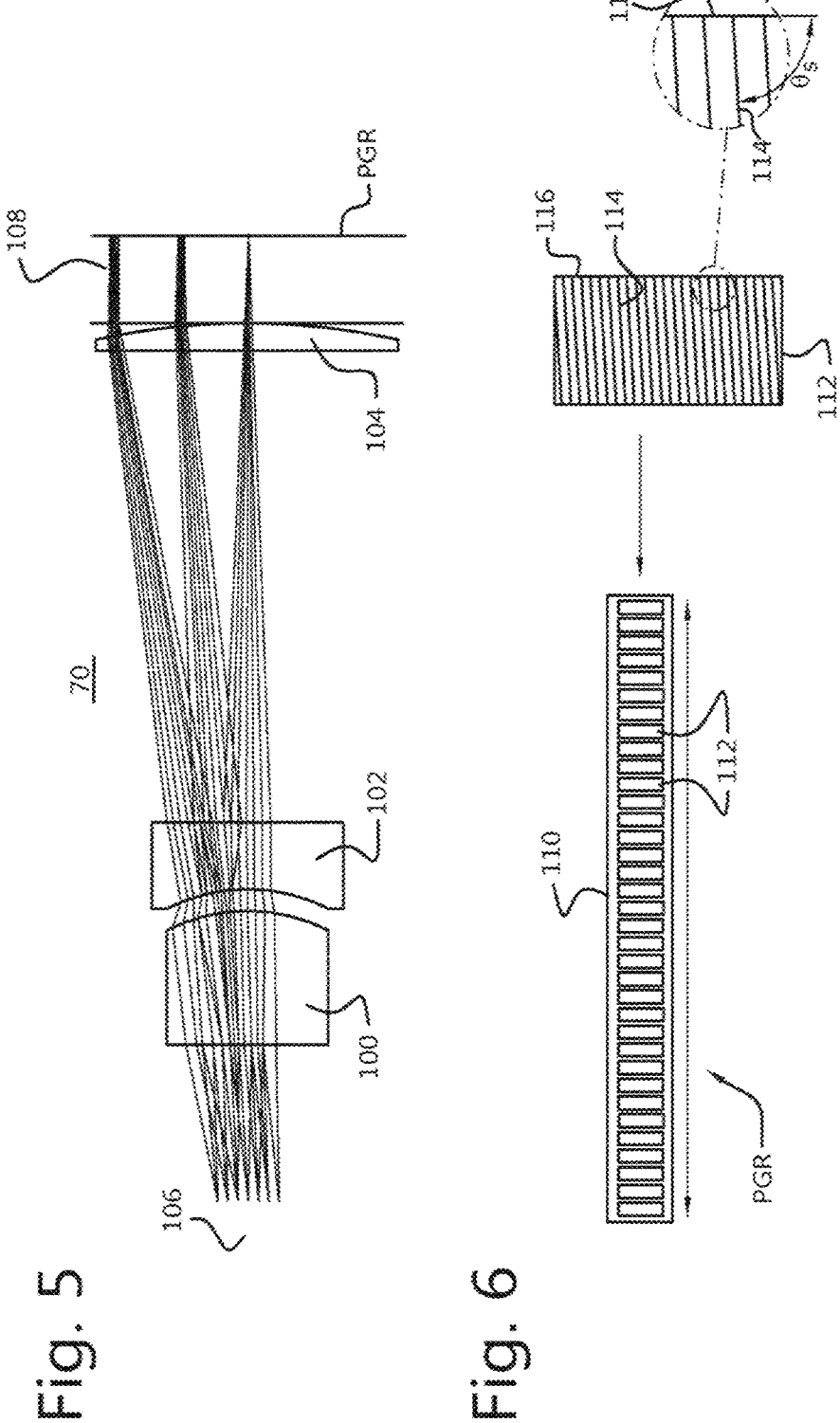
FIG. 5 depicts a schematic side view of an embodiment of a lens system for the projection unit according to the disclosure.
FIG. 6 depicts a schematic front view of an embodiment of a projection grating for the projection unit according to the disclosure.

Referring to FIG. 5, the lens device 70 may comprise one or more lenses 100, 102, 104. In an embodiment, the lens device may comprise a single lens, or a limited number of lenses such as three lenses. On a first side 106 the lens device 70 has a first focal point. The first focal point is, in a preferred embodiment, positioned substantially at, or in the plane of, the second outlet 60 of the second light pipe. On an opposite side 108, the lens device outputs radiation having substantially parallel rays of radiation. The output of the lens device 70 may be directed towards the grating PGR.

Referring to FIG. 6, the grating PGR may be arranged on one side 108 of the lens device 70. The grating PGR is positioned, to be illuminated by the radiation exiting the lens device 70. The grating PGR may comprise an array 110 of grating units 112. Each grating unit may be provided with a number of slits 114. The slits may have a predetermined size to filter the radiation. The grating units 112 may be rectangular. The slits may be arranged obliquely with respect to sides 116 of the respective grating unit 112. In a practical embodiment, the slits 114 may be positioned at an angle $q_s$ with respect to the sides 116 of the respective grating unit 112. Said angle is between 0 and 90 degrees, for instance about 10 or 20 degrees.

Figure 7A:
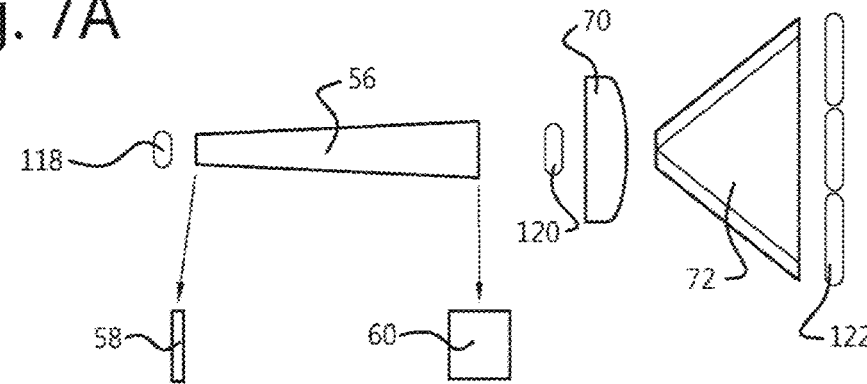
FIG. 7A depicts a diagrammatic side view of an embodiment of a projection unit according to the disclosure.

Referring to FIG. 7A, the system of the disclosure may comprise the image multiplier 72. The image multiplier device 72 may be adapted to multiply an image 120 provided by the second light pipe, the grating PGR and/or the lens 70 and provide a multiplied image 122. FIG. 7A shows image 118—having a certain shape, intensity and irradiance (see FIG. 8B)—entering the second light pipe 56 and exiting as image 120.

Figure 7B:
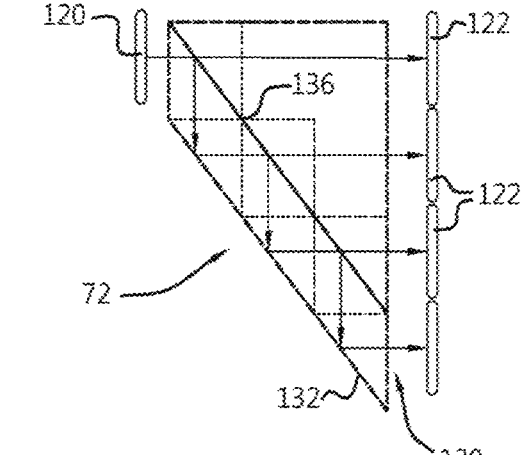
FIG. 7B depicts a diagrammatic side view of an embodiment of an image multiplier device for the projection unit according to the disclosure.

The image multiplier 72 may comprise, for instance, a beam splitter 130 provided with one or more reflective devices such as prisms 132, 134. See FIG. 3. FIG. 7B shows an embodiment of the image multiplier 72 wherein the beam splitter 130 and multiple prisms 132 are integrated. The image 120 may be multiplied multiple times along its length. The image 120 may be multiplied three or four times, for instance. The beam splitter 130 includes a partially reflective internal surface 136. The surface 136 partially transmits the image 120, and partially reflects the image towards a respective prism.

A splitting ratio per beam splitter may be expressed as:

$$p_n = p_0 \frac{1}{n},$$

with $P_0$ the radiation power of the incident radiation, $P_n$ the power of the $n^{th}$ split image, and N the total number of image duplications. Said power is preferably the same for each duplication. Or, in other words, if $\Phi_0$ is the initial total flux to be split, N the number of splits we want to achieve and $\Phi_1$, $\Phi_2$, . . . , $\Phi_N$ is the flux on each spot of the resulting multiplied image, then:

$$\Phi_1 = \Phi_2 = \cdots = \Phi_N = \frac{\Phi_0}{N}$$

For the example wherein the image is multiplied N times, the projection unit includes N−1 beam splitters. The transmission factor T of the $k^{th}$ beam splitter is:

$$T = \frac{1}{N+1-k}$$

As an example, in case N=3 (See FIGS. 3 and 7A), the transmission factor of the first beam splitter is about 33.3% and that of the second one is 50%.

Figure 7C:
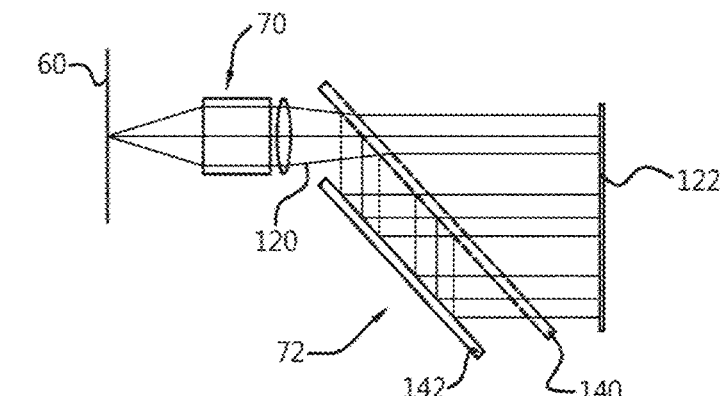
FIG. 7C depicts a diagrammatic side view of another embodiment of an image multiplier device for the projection unit according to the disclosure.

In an alternative embodiment, see FIG. 7C, the image multiplier includes a Bowen Walraven Image Slicer. The slicer comprises, for instance, a first mirror 140 and a second mirror 142 arranged in parallel to the first mirror. The radiation is reflected between said mirrors, and part of the reflected radiation is directed towards a target, i.e. the grating PGR.

In a practical embodiment, the image 120 of radiation exiting the second light pipe 56, or the grating PGR, may have an aspect ratio of width to height of at least 1:1.5, or at least 1:2, for instance in the range of about 1:3 to 1:6. The image multiplier 72 may be adapted to increase said ratio. The image multiplier may result in an aspect ratio of at least 1:2. The image multiplier may copy the image 120 at least twice, thus at least doubling the aspect ratio. In practice, the resulting aspect ratio may exceed 1:8, for instance about 1:9 to 1:15. The image multiplier 72 enables to use a shorter main light pipe 56.

In a practical embodiment, when the projection unit includes a beam splitter 72, the main light pipe 56 can have a length of about 40 cm or less, for instance about 20 to 35 cm. Length herein indicates a distance between the second inlet 58 and the second outlet 60. The first light pipe 50 may be shorted than the main light pipe 56. For instance, the first light pipe 50 may have a length of about 20 cm or less, for instance about 10 to 15 cm. Length herein indicates a distance between the first inlet 52 and the first outlet 54.

Depending on the length of the first and second light pipes, the radiation may reflect inside said pipes one or more times. In a practical embodiment, part of the radiation will reflect multiple times, whereas another part of the radiation may continue straight without reflecting of reflect only a single time. As a result, the distribution of irradiance and intensity changes. Irradiance (or flux density) is a term of radiometry and is defined as the radiant flux received by some surface per unit area. In the SI system, it is specified in units of W/m2 (watts per square meter). The term intensity, or optical intensity, has the same units as the irradiance. It is not the same quantity, however. The intensity is defined as the amount of energy going through an area perpendicular to the beam, while irradiance refers to the amount of energy arriving on a certain surface with a given orientation.

Figure 8B:
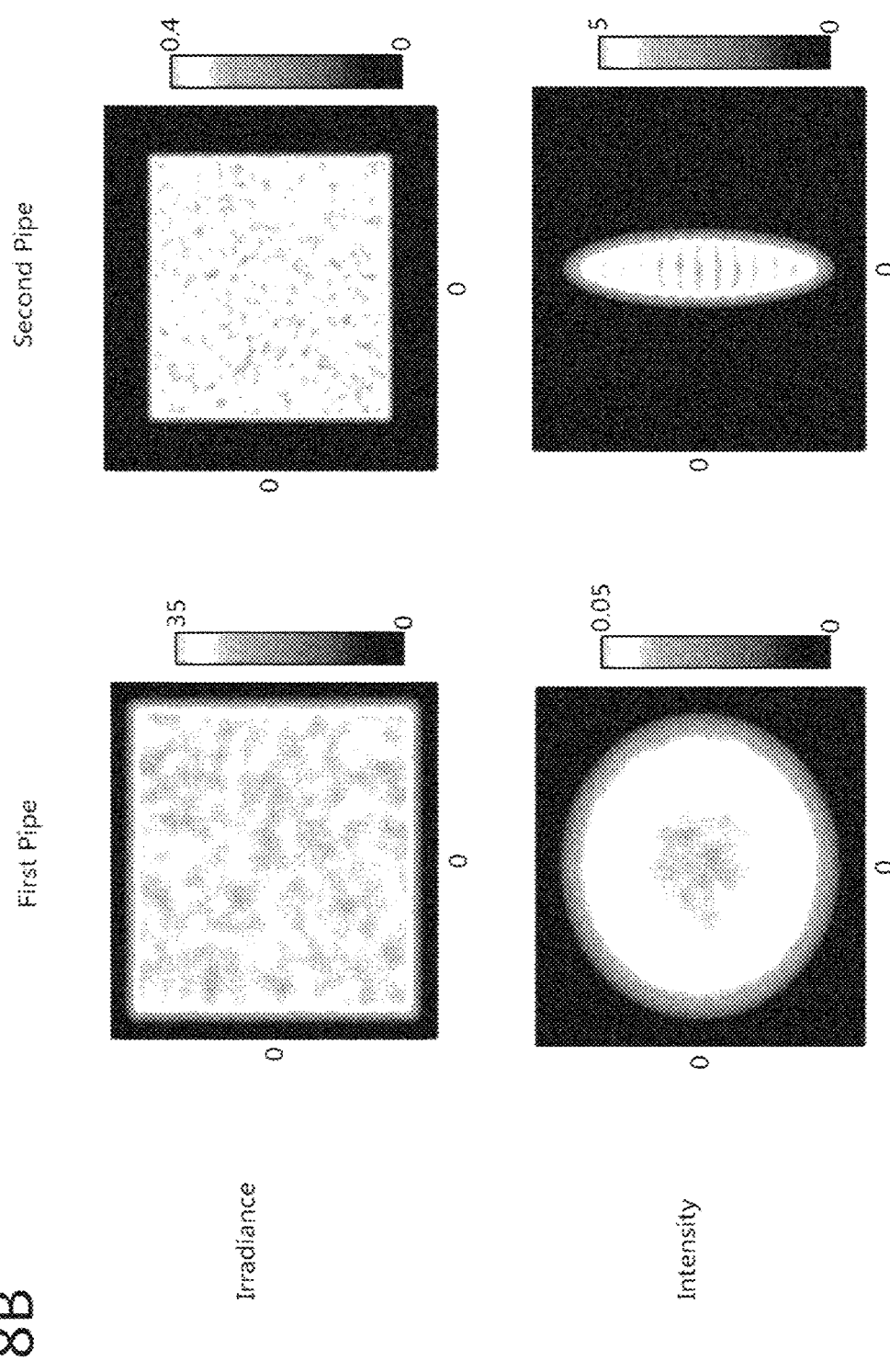
Figure 8C:
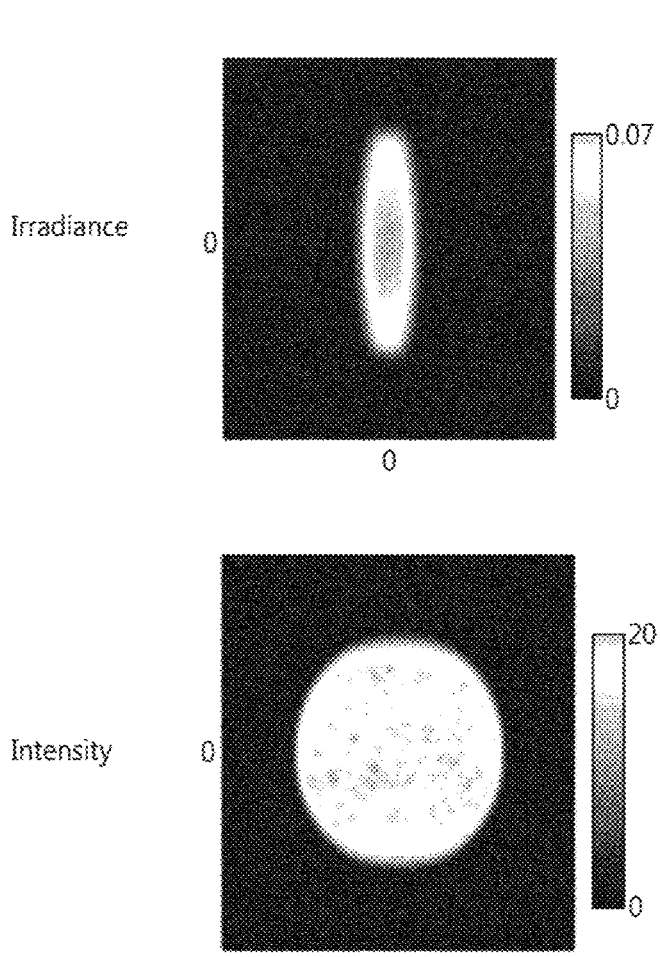

FIGS. 8A to 8C show examples of both the distribution of irradiance (top row) and intensity (bottom row) for practical embodiments of the device and method of the disclosure. Herein, at the start the distribution of irradiance and intensity start are substantially round (as produced by the source LSO and transmitted by the (optional) light guide LG. See the diagrams in FIG. 8A. Please note that the light guide in the system of the present disclosure can be a simple, single, round, radiation transmitting fiber. The system obviates the need for elaborate multi-fiber light guides to form the beam into a predefined shape.

The light pipes transform the shape and distribution of the radiation. FIG. 8B show diagrammatical examples of the output of the first light pipe and the second light pipe. The first light pipes changes the irradiance distribution to a substantially square shape, while the intensity distribution is still substantially circular. The second light pipe, due to its asymmetrical shape, keeps the square shape of the irradiance distribution, while changing the intensity distribution to a substantially elliptical shape. As shown in FIG. 8C, the lens 72 subsequently changes the irradiance distribution to a substantially elliptical shape, while the intensity distribution is circular.

As an example, as the entrance pupil of the Fourier lens, the length D calculated above is the height of the exit surface of the second light pipe. D fixes the height and width of the exit surface since the exit surface of the pipe is symmetrical. In an exemplary embodiment, we decide to overfill in the x-direction to make sure that the irradiance is uniform over the entire grating PGR. The ratio of height to width may be fixed at the Fourier plane of the lens 70, for instance at $y'_p/x'=4$. As a result therefore, $d_y=4d_x$. The output NA of the second light pipe may therefore be fixed, which means that fixing the taper will also fixe the NA of the light coupled into the pipe according to the equation above. As when the taper is too high compared to the length of the pipe, the mixing is compromised and kaleidoscopic images start to appear on the irradiance distribution. In a practical embodiment, the lowest taper is selected providing uniform irradiance distribution. Said taper is about 3x.

In a practical embodiment, parameters of the second light pipe may be: Pipe length in the order of 40 cm; inlet surface having a width in the order of 0.30 to 0.40 mm and a height in the order of 1.2 to 2 mm; outlet surface having a width and height in the order of 3 to 6 mm; inlet NA in the order of 0.3 to 0.5; outlet NA in the order of 0.1 to 0.3.

Using relatively few and simple components, the system and method of the disclosure allow to shape both the irradiance distribution and intensity distribution according to a predetermined shape, form and level. Given the limited number of components, and the components as such, absorption of radiation is minimized. The system allows the use of a single, off-the-shelf multimode fiber as light guide. Thus the system of the invention obviates complex beam shaping multi-fiber structures.

The present disclosure offers a redesign of the illumination optics (IO) and allows a corresponding simplification of the light guide (LG). In the disclosed system, homogenization of the irradiance distribution is not required by the MO. As a result, the number of components can be reduced (for instance from 12 down to 5 components). The LG fiber bundle can be replaced with a single LG fiber. The number of components, and associated costs, is reduced and transmission efficiency is increased. A coupling pipe (first light pipe) magnifies the numerical aperture (NA) between the LG and a main light pipe (second light pipe, which homogenizes the irradiance distribution and shapes the intensity distribution of light to provide uniform illumination with the correct aspect ratio (height to width ratio). A Fourier lens acts to match the required NA at the target and converts the intensity distribution of the incident beam into the irradiance distribution on the target and the incident irradiance distribution into the intensity distribution on the target plane. A projection grating is located in the target plane.

The projection unit of the disclosure achieves irradiance uniformity. The light will be delivered from the simplified light guide to the IO module by a simple multimode fiber that will ensure the uniformity of the intensity distribution of the light delivered to the IO module.

The projection unit and method of the disclosure achieve uniform illumination, in both spatial and angular space, from the light source to the projection grating PGR, using fewer and less complex elements as conventional systems. Consequently, the unit will be relatively affordable. The projection unit enables to attain uniform and symmetrical intensity distribution as well as uniform and asymmetrical irradiance distribution in order to match the shape of the projection grating.

Those skilled in the art should see that in the case of this alternative application, any term "wafer" or "die" used therein can be regarded as the same as the more general term "substrate" or "target part", respectively. The substrate referred to here can be processed before or after exposure, such as in the track (a tool that typically applies a resist layer to the substrate and develops the exposed resist), measurement tools and/or inspection tools. Where applicable, the content disclosed herein can be applied to this and other substrate processing tools. In addition, the substrate may be processed more than once, for example, to produce a multilayer IC, so that the term "substrate" used herein may also refer to a substrate that already contains multiple processed layers.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below. Other aspects of the invention are set out as in the following numbered clauses:

1. A projection unit for a level sensor, comprising:
a first light pipe having a first inlet configured to receive radiation from a source and a first outlet; and
a second light pipe having a second inlet configured to receive the radiation from the first light pipe and a second outlet.

2. The projection unit of clause 1, comprising:
a lens device configured to receive radiation from the second outlet and to output radiation having a predetermined distribution of intensity and irradiance.

3. The projection unit of clause 2, the lens device having a focal point on one side located at the second outlet 4. The projection unit of one of the previous clauses, the first light pipe having tapering walls, wherein a width and height of the first inlet exceeds a width and height of the first outlet.

5. The projection unit of one of the previous clauses, wherein the first light pipe is symmetrical along its longitudinal axis.

6. The projection unit of one of the previous clauses, the second light pipe having tapering walls, wherein a width and height of the second outlet exceeds a width and height of the second inlet.

7. The projection unit of one of the previous clauses, wherein the second light pipe is asymmetrical along its longitudinal axis.

8. The projection unit of clause 7, wherein the second inlet has a ratio of width with respect to height in the range of 1:1.5 to 1:14; and/or wherein the second outlet has a ratio of width with respect to height in the range of 1:1.

9. The projection unit of one of the previous clauses, comprising a grating arranged on an opposite side of the lens system to be illuminated by the radiation exiting the lens device, the grating comprising an array of grating units, each grating unit being provided with a number of slits having a predetermined size to filter the radiation.

10. The projection unit of clause 9, the grating units being rectangular, and the slits being arranged obliquely with respect to sides of the respective grating unit.

11. The projection unit of one of clauses 9 or 10, comprising an image multiplier device arranged to receive radiation exiting the projection grating, the radiation exiting the projection grating having an aspect ratio, and the image multiplier device being adapted to increase said ratio.

12. The projection unit of clause 11, the radiation exiting the projection grating having an aspect ratio of width to height of at least 1:1.5, and the image multiplier device being adapted to increase said ratio to at least 1:2.

13. The projection unit of one of the previous clauses, comprising:

a light module comprising a light source to produce the radiation; and a light guide configured to receive the radiation from the light module and transfer the radiation to the first light pipe.

14. The projection unit of clause 13, the light guide being a single multimode fiber.

15. A lithographic system comprising a level sensor for measuring height of a substrate, the level sensor comprising a projection unit according to clause 1.

16. A method of monitoring height of a substrate using a level sensor having a projection unit, the method comprising the steps of:

directing radiation to a first light pipe; and using a second light pipe to receive radiation exiting the first light pipe.

17. The method of clause 16, comprising the step of using a lens system to receive radiation exiting the second light pipe, the lens system being configured to output radiation having a predetermined distribution of intensity and irradiance.

18. A metrology assembly comprising the projection unit of any one of clauses 1 to 14.

The invention claimed is:

1. A projection unit for a level sensor, the projection unit comprising:

a first light pipe having a first inlet configured to receive radiation from a source and a first outlet;

a second light pipe having a second inlet configured to receive the radiation from the first light pipe and a second outlet;

a lens system configured to receive radiation from the second outlet and to output radiation having a predetermined distribution of intensity and irradiance;

a grating arranged to be illuminated by the radiation exiting the lens system, the grating comprising an array of grating units, each grating unit comprising a number of slits having a predetermined size to filter the radiation; and an image multiplier device arranged to receive radiation exiting the grating, the radiation exiting the grating having an aspect ratio, and the image multiplier device configured to increase the aspect ratio.

2. The projection unit of claim 1, wherein the lens system has a focal point on one side located at the second outlet.

3. The projection unit of claim 1, wherein the first light pipe has tapering walls, and wherein a width and height of the first inlet exceeds a width and height of the first outlet.

4. The projection unit of claim 1, wherein the first light pipe is symmetrical along its longitudinal axis.

5. The projection unit of claim 1, wherein the second light pipe has tapering walls, and wherein a width and height of the second outlet exceeds a width and height of the second inlet.

6. The projection unit of claim 1, wherein the grating units are rectangular, and the slits are arranged obliquely with respect to sides of the respective grating unit.

7. The projection unit of claim 1, wherein the radiation exiting the projection grating has an aspect ratio of width to height of at least 1:1.5, and the image multiplier device is configured to increase the aspect ratio to at least 1:2.

8. The projection unit of claim 1, further comprising:

a light module comprising a light source to produce the radiation; and a light guide configured to receive the radiation from the light module and transfer the radiation to the first light pipe.

9. The projection unit of claim 8, wherein the light guide is a single multimode fiber.

10. A lithographic system comprising a level sensor for measuring height of a substrate, the level sensor comprising the projection unit according to claim 1.

11. A method of monitoring height of a substrate, the method comprising:

receiving radiation from a radiation source into a first light pipe of a projection unit of a level sensor, wherein at least some of the radiation reflects off an interior of the first light pipe;

receiving radiation exiting the first light pipe into a second light pipe of the projection unit of the level sensor, wherein at least some of the radiation reflects off an interior of the second light pipe; and providing the radiation from the second light pipe toward the substrate for monitoring of the height of the substrate.

12. The method of claim 11, further comprising using a lens system to receive radiation exiting the second light pipe, the lens system configured to output radiation having a predetermined distribution of intensity and irradiance.

13. The method of claim 12, wherein the lens system has a focal point on one side located at an outlet of the second light pipe.

14. The method of claim 11, further comprising illuminating a grating by the radiation exiting the lens system, the grating comprising an array of grating units, each grating unit comprising a number of slits having a predetermined size to filter the radiation.

15. The method of claim 14, wherein the radiation exiting the grating has an aspect ratio and further comprising increasing the aspect ratio using an image multiplier device arranged to receive radiation exiting the grating.

16. The method of claim 15, wherein the radiation exiting the projection grating has an aspect ratio of width to height of at least 1:1.5, and comprising increasing the aspect ratio to at least 1:2 using the image multiplier device.

17. The method of claim 14, wherein the grating units are rectangular, and the slits are arranged obliquely with respect to sides of the respective grating unit.

18. The method of claim 11, wherein the first light pipe has tapering walls, and wherein a width and height of an inlet of the first light pipe exceeds a width and height of an outlet of the first light pipe.

19. The method of claim 11, wherein the second light pipe has tapering walls, and wherein a width and height of the second outlet exceeds a width and height of the second inlet.

20. A projection unit for a level sensor, the projection unit comprising:

a first light pipe having a first inlet configured to receive radiation from a source and a first outlet;

a second light pipe having a second inlet configured to receive the radiation from the first light pipe and a second outlet;

a lens system configured to receive radiation from the second outlet and to output radiation having a predetermined distribution of intensity and irradiance;

a grating arranged to be illuminated by the radiation exiting the lens system and configured to provide the radiation toward a substrate for measurement by the level sensor.

\* \* \* \* \*